(12) United States Patent
Ong et al.

(10) Patent No.: US 7,535,274 B2
(45) Date of Patent: May 19, 2009

(54) DELAY CONTROL CIRCUIT

(75) Inventors: Keng-Khai Ong, Hsinchu (TW);
Yun-Yin Lien, Taoyuan County (TW);
Yew-San Lee, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 11/772,371

(22) Filed: Jul. 2, 2007

(65) Prior Publication Data

US 2008/0122513 A1    May 29, 2008

(30) Foreign Application Priority Data

Jul. 6, 2006    (TW) ................ 95124637 A (51) Int. Cl.
*H03L 7/06*    (2006.01)
(52) U.S. Cl. ................ 327/158; 327/161; 327/263; 327/269
(58) Field of Classification Search ................ None
See application file for complete search history.

(56) References Cited

U.S. PATENT DOCUMENTS

| | | | |
|---|---|---|---|
| 6,104,223 A * | 8/2000 | Chapman et al. | 327/276 |
| 6,424,197 B1 | 7/2002 | Salcedo et al. | |
| 6,720,810 B1 * | 4/2004 | New | 327/158 |
| 6,870,415 B2 * | 3/2005 | Zhang et al. | 327/274 |
| 6,987,700 B1 * | 1/2006 | Hong et al. | 365/194 |
| 7,339,407 B2 * | 3/2008 | Jakobs et al. | 327/158 |

* cited by examiner

*Primary Examiner*—An T Luu
(74) *Attorney, Agent, or Firm*—J.C. Patents (57) ABSTRACT

A delay control circuit includes a first delay unit, a signal regulation unit, a selector and a second delay unit. The first delay unit is used for delaying an input signal and generates a delayed input signal. The signal regulation unit is coupled to the first delay unit and outputs a rising edge delay signal and a falling edge delay signal according to the input signal and the delayed input signal. The selector is coupled with the signal regulation unit and outputs one of rising edge delay signal and falling edge delay signal according to the control signal. The second delay unit is coupled to the selector for delaying the output of the selector and outputting an output signal.

11 Claims, 12 Drawing Sheets

FIG. 7B (a) BIG CODE UNIT

| dr[2:0] or df[2:0] | | | FIRST CONVERSION SIGNAL | | | | | | | |
|---|---|---|---|---|---|---|---|---|---|---|
| | | | 7 | | | | | | | 0 |
| 0 | 0 | 0 | 1 | 1 | 1 | 1 | 1 | 1 | 1 | 1 |
| 0 | 0 | 1 | 0 | 1 | 1 | 1 | 1 | 1 | 1 | 1 |
| 0 | 1 | 0 | 0 | 0 | 1 | 1 | 1 | 1 | 1 | 1 |
| 0 | 1 | 1 | 0 | 0 | 0 | 1 | 1 | 1 | 1 | 1 |
| 1 | 0 | 0 | 0 | 0 | 0 | 0 | 1 | 1 | 1 | 1 |
| 1 | 0 | 1 | 0 | 0 | 0 | 0 | 0 | 1 | 1 | 1 |
| 1 | 1 | 0 | 0 | 0 | 0 | 0 | 0 | 0 | 1 | 1 |
| 1 | 1 | 1 | 0 | 0 | 0 | 0 | 0 | 0 | 0 | 1 |

(b) SMALL CODE UNIT

| dr[2:0] or df[2:0] | | | SECOND CONVERSION SIGNAL | | | | | | | |
|---|---|---|---|---|---|---|---|---|---|---|
| | | | 7 | | | | | | | 0 |
| 0 | 0 | 0 | 1 | 0 | 0 | 0 | 0 | 0 | 0 | 0 |
| 0 | 0 | 1 | 1 | 1 | 0 | 0 | 0 | 0 | 0 | 0 |
| 0 | 1 | 0 | 1 | 1 | 1 | 0 | 0 | 0 | 0 | 0 |
| 0 | 1 | 1 | 1 | 1 | 1 | 1 | 0 | 0 | 0 | 0 |
| 1 | 0 | 0 | 1 | 1 | 1 | 1 | 1 | 0 | 0 | 0 |
| 1 | 0 | 1 | 1 | 1 | 1 | 1 | 1 | 1 | 0 | 0 |
| 1 | 1 | 0 | 1 | 1 | 1 | 1 | 1 | 1 | 1 | 0 |
| 1 | 1 | 1 | 1 | 1 | 1 | 1 | 1 | 1 | 1 | 1 |

DELAY CONTROL CIRCUIT

CROSS-REFERENCE TO RELATED APPLICATION

This application claims the priority benefit of Taiwan application serial no. 95124637, filed on Jul. 6, 2006. All disclosure of the Taiwan application is incorporated herein by reference.

BACKGROUND OF THE INVENTION

1. Field of the Invention

The present invention relates to a delay control circuit capable of adjusting the delay time of a signal, and more particularly, to a delay control circuit capable of controlling the rising edge delay time and the falling edge delay time of a signal, respectively.

2. Description of the Related Art

In coordination with a high speed digital transfer interface for delivering data, usually, a timing of a sampling control signal is demanded, by which the receiving terminal performs sampling operations. The timing is in charge of coordinating the delivering data at a transmission terminal and the sampling data at a receiving terminal and works based on a predetermined rule (for example, triggered by the rising edge of the sampling control signal or triggered by the falling edge of the sampling control signal), so as to ensure the maximum setup capacity and keep a proper time margin.

In practice, the sampling control signal adjusts slightly the delay time at the transmission terminal or the receiving terminal to maintain a proper time margin. In the prior art, the delay of a sampling control signal is usually performed by a programmable delay cell or a delay lock loop. However, regardless of a programmable delay cell or using a delay lock loop, both the rising edge and falling edge of the sampling control signal have the same delay time. In other words, the rising edge delay time would be equal to the falling edge delay time after performing a delay time adjustment on the sampling control signal.

The above-mentioned adjustment scheme is appropriate to such a system where a single edge (rising edge or falling edge) is used. However, in a high speed system, for example the system adopting the Ultra DMA (DMA standing for direct memory access) transfer mode in its ATA (AT attachment standard) interface or the DDR SDRAM system, both the rising edge or falling edge of a sampling control signal are used for triggering in transferring data. Therefore, a conventional delay circuit is not competent for delaying a sampling control signal where the time margins both of the rising edge and the falling edge must be taken into account.

Figure 1:
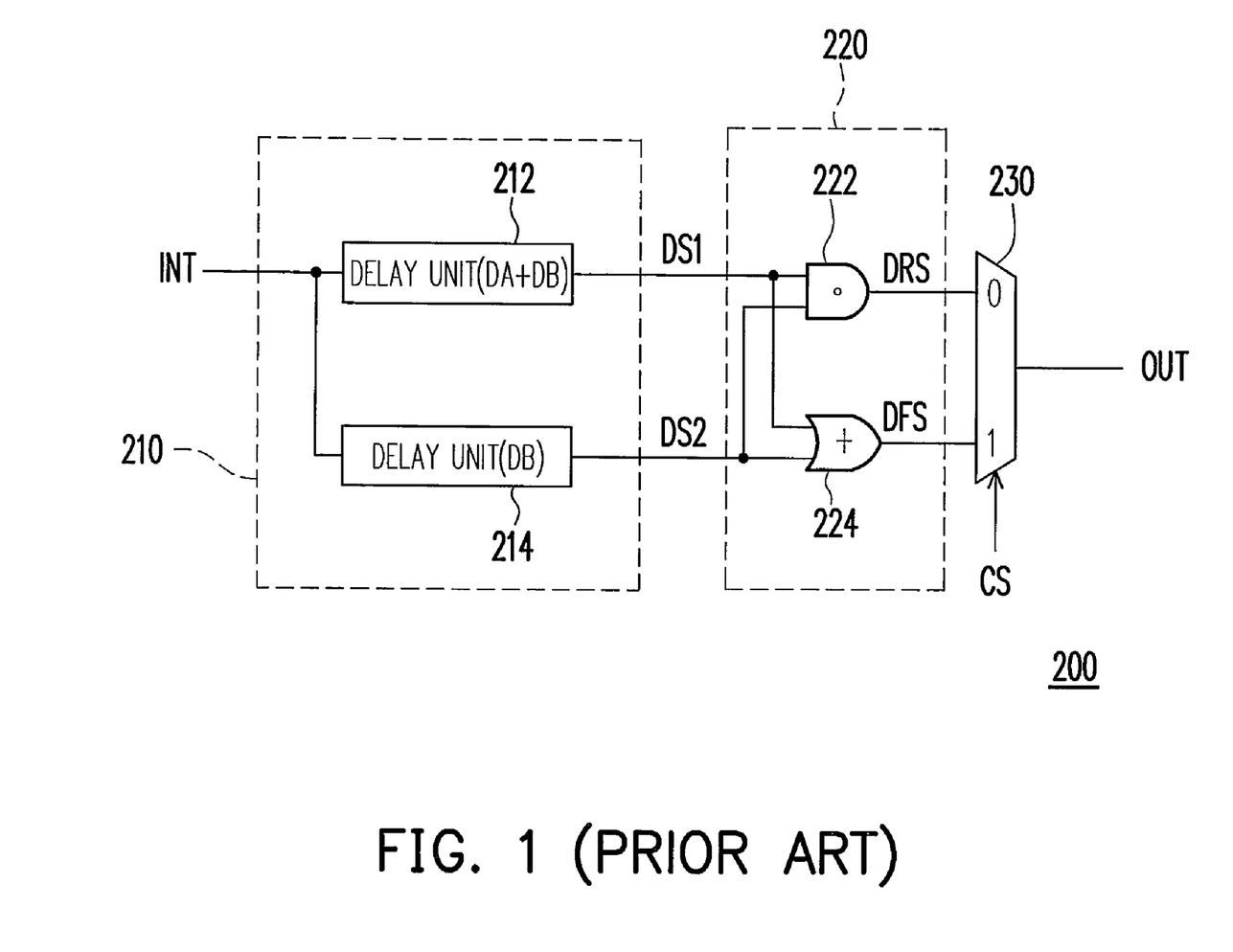
FIG. 1 is a schematic drawing of a conventional delay control circuit.

FIG. 1 is a schematic drawing of a conventional delay control circuit. The delay control circuit 200 herein includes delay units 212 and 214, an AND gate 222, an OR gate 224 and a selector 230. Wherein the delay units 212 and 214 form a delay unit 210, and the AND gate 222 and the OR gate 224 form a signal regulation unit 220. An input signal INT is delayed by the delay unit 212 with the delay time of (DA+DB) to generate a delayed input signal DS1 and is delayed by the delay unit 214 for the delay time of DB to generate a delayed input signal DS2. Both the delayed input signal DS1 and the delayed input signal DS2 are processed by the AND gate 222 to output a rising edge delay signal DRS that delays the rising edge of the input signal INT for the delay time of (DA+DB) and falling edge of the input signal INT for the delay time of DB, while processed by the OR gate 224 to output a falling edge delay signal DFS that delays the rising edge of the input signal INT with the delay time of DB and falling edge of the input signal INT with the delay time of (DA+DB). Then, the selector 230 decides whether the output signal is the rising edge delay signal DRS or the falling edge delay signal DFS according to a control signal CS.

Figure 2A:
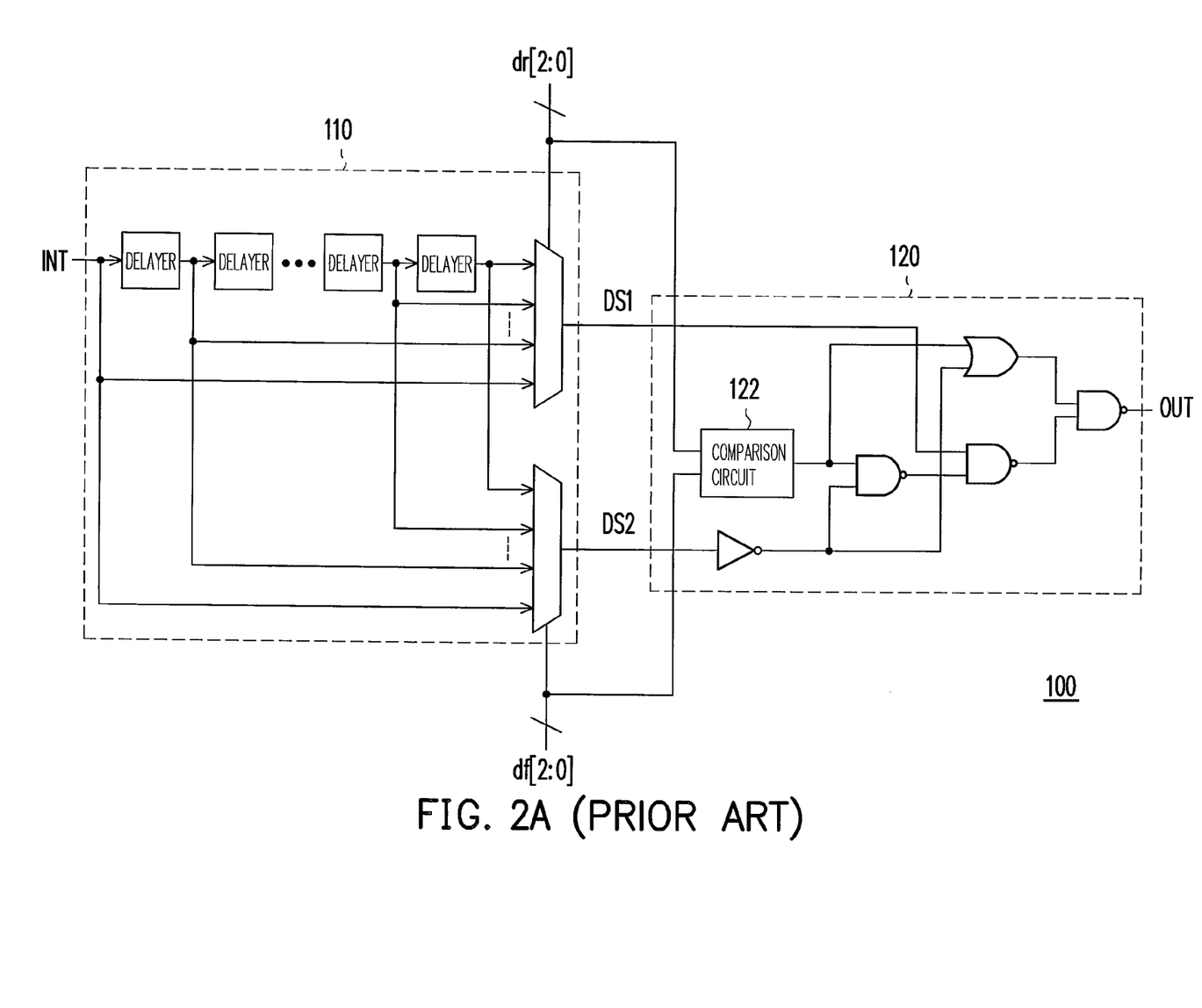
FIG. 2A is an excerpted diagram of a delay control circuit according to the U.S. Pat. No. 6,424,197.

FIG. 2A is the excerpted drawing of a delay control circuit according to the U.S. Pat. No. 6,424,197. The delay control circuit 100 herein includes a delay unit 110 and a signal regulation unit 120. The delay unit 110 outputs delayed input signals DS1 and DS2 to the signal regulation unit 120 according to control signals dr[2:0] and df[2:0]. After the logic operations, the signal regulation unit 120 generates an output signal OUT by delaying the rising edge of the input signal INT with delay time of DR and falling edge of the input signal with delay time of DF. Wherein, if the output of a comparison circuit 122 is a low logic level (DF>DR), the output signal OUT is the result of an 'OR' logic operation on the delayed input signals DS1 and DS2; if the output of a comparison circuit 122 is a high logic level (DR>DF), the output signal OUT is the result of an 'AND' logic operation on the delayed input signals DS1 and DS2.

Figure 2B:
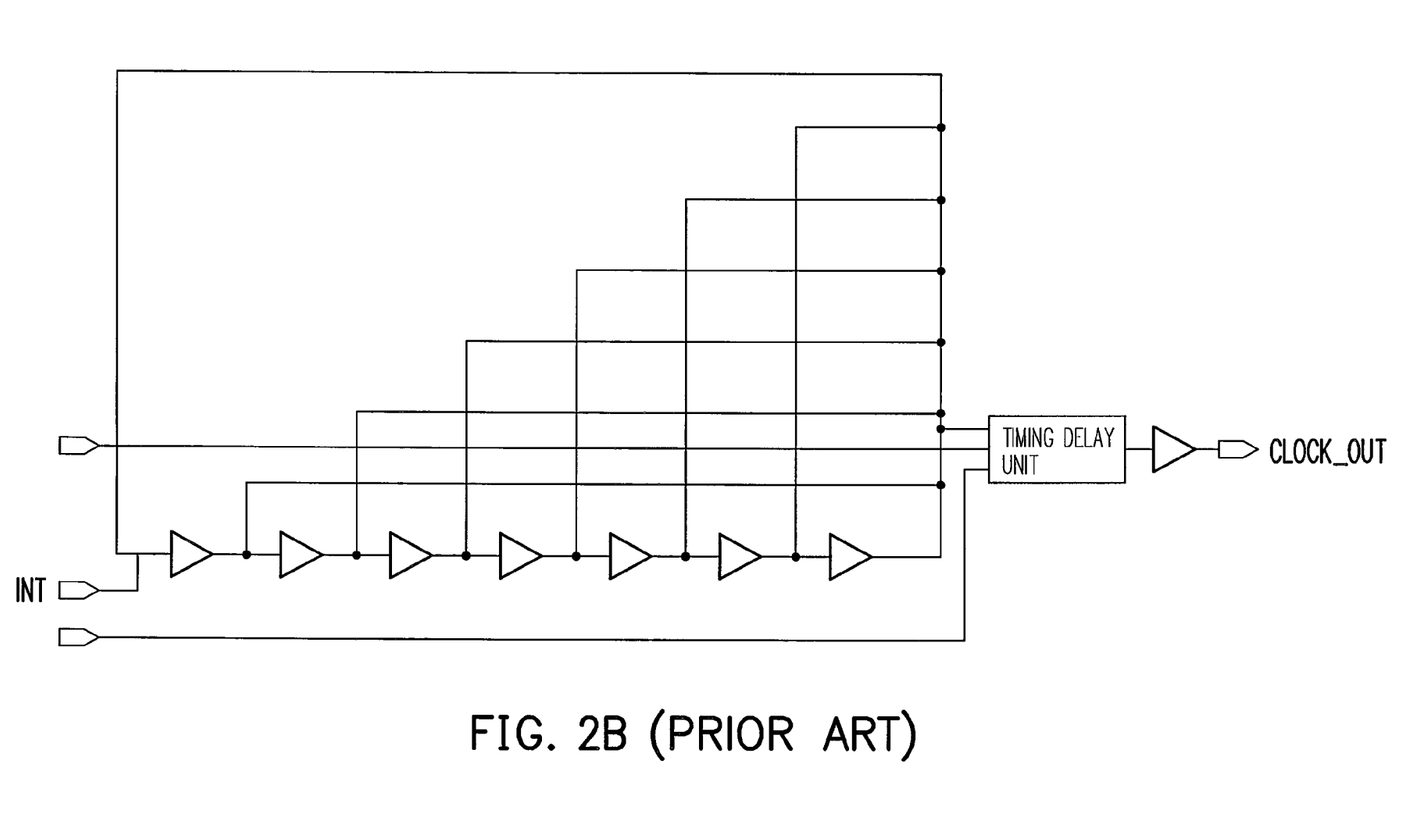
FIG. 2B is an excerpted diagram of a delay unit according to the U.S. Pat. No. 6,424,197.

FIG. 2B is the excerpted diagram of a delay unit according to the U.S. Pat. No. 6,424,197. As shown by FIG. 2B, a plurality of buffers are in series connection to delay the input signal INT, wherein each buffer adds a different delay time to the input signal INT which comes in the buffer and then is output. After that, the multiplexers in FIG. 2C output the required delayed input signals DS1 and DS2 according to the control signals dr[2:0] and df[2:0]. The signal regulation unit 120 in FIG. 2C generates the output signal OUT according to the delayed input signals DS1 and DS2, wherein an 'AND' logic operation or an 'OR' logic operation on the delayed input signals DS1 and DS2 results in the output signal OUT.

Figure 2C:
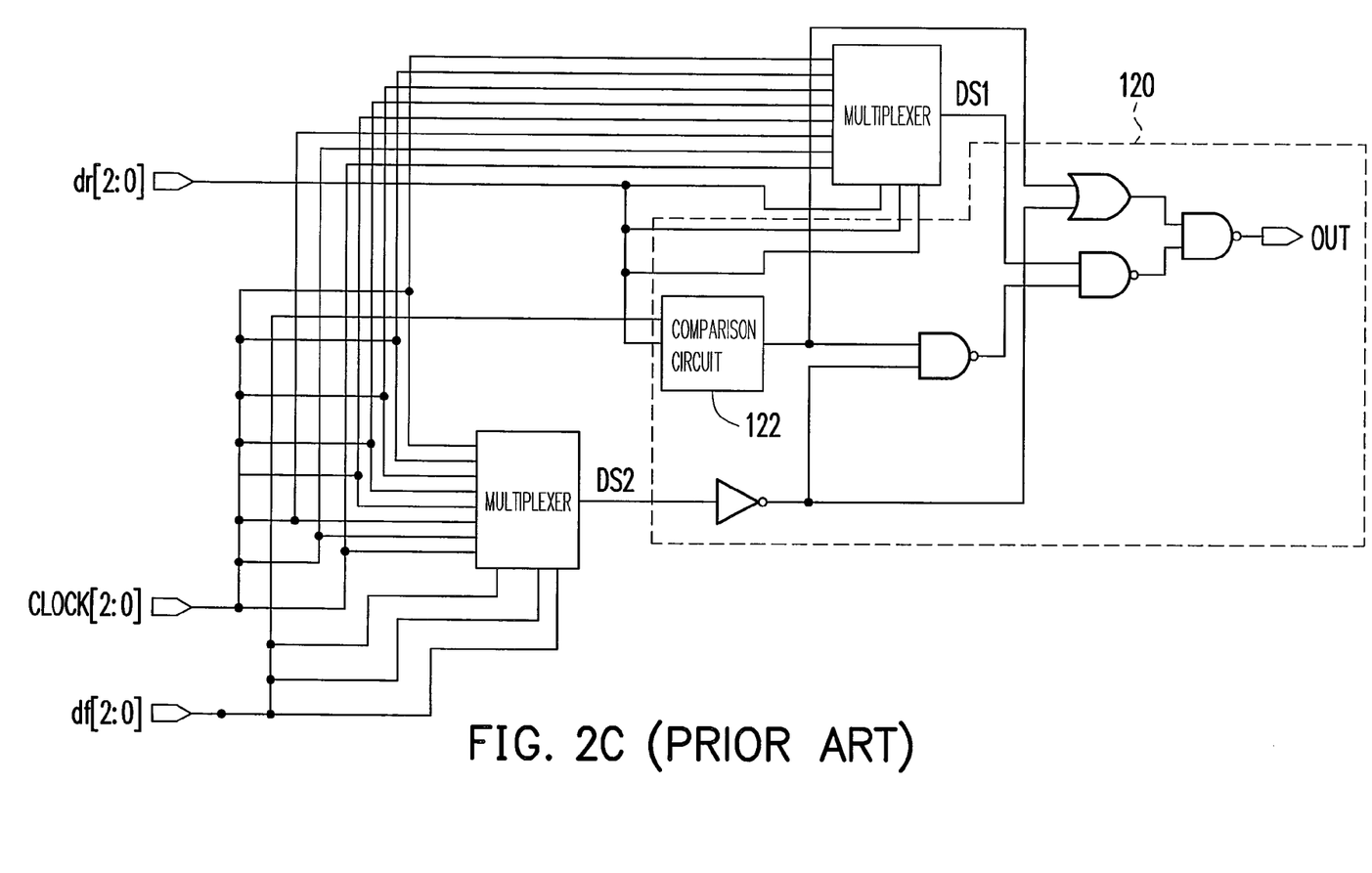
FIG. 2C is an excerpted diagram of another delay control circuit according to the U.S. Pat. No. 6,424,197.
Figure 2D:
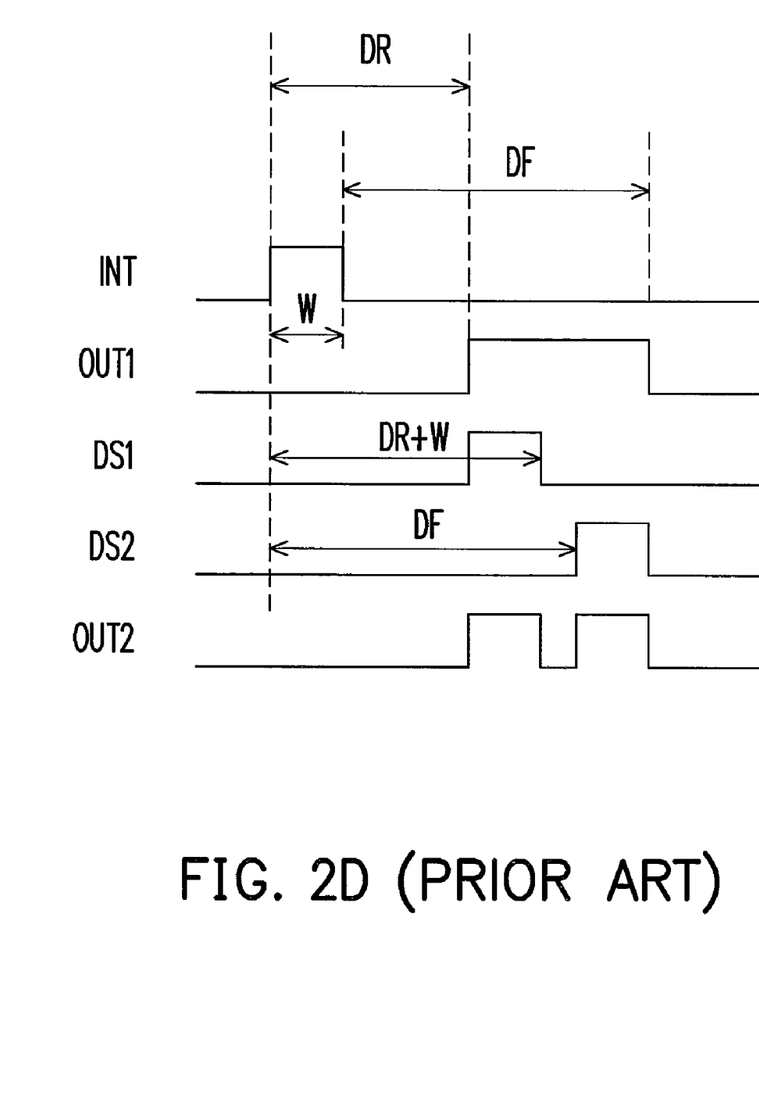
FIG. 2D is a problem signal timing diagram corresponding to the embodiments illustrated by FIGS. 2A, 2B and 2C when DR−DF>W (DR, DF, W are all positive value)

In a practical application in anyone of the above-described delay control circuits of FIGS. 2A, 2B and 2C, if the delay time difference between DR and DF are larger than input signal pulse width, an error of the output signal OUT could occur. As shown in FIG. 2D, wherein W represents the pulse width of the input signal INT, DR and DF respectively represent the delay time of the rising edge and the falling edge of the input signal INT, the expected output signal from the signal regulation unit 120 should be illustrated by OUT1. However, due to the delayed input signals DS1 and DS2 outputted from the delay unit 110 having an excessive delay time difference there-between, the real output signal OUT2 of the signal regulation unit 120 has an error as shown by FIG. 2D, rather than the expected OUT1.

In particular, the delay unit 210 or 110 in FIGS. 1 and 2A is formed usually by a plurality of delayers in series connection to each other, and each of the delayers gives out an inconsistent delay time relying on the individual process condition. Such an uncertainty more likely causes an error of the output signal for slightly adjusting a high speed signal. Hence, if the delay time given by a conventional circuit is controlled more efficiently, a more stable output of a delay control circuit is expected, which would certainly benefit the delay control of high frequency signals.

SUMMARY OF THE INVENTION

Based on the above description, an objective of the present invention is to provide a delay control circuit for controlling the delay of a signal and respectively adjusting the rising edge delay time and the falling edge delay time thereof and suitable for an input signal with a higher frequency.

Another objective of the present invention is to provide a delay control circuit for adjusting the duty cycle of an input signal first and performing delay on the signal for adjusting the delay time of the rising edge and the falling edge of the input signal.

Another objective of the present invention is to provide a delay control circuit, which employs a delay-locking loop (DLL) to generate a stable delay control voltage for adjusting the delay time of voltage controlled delay cells, so as to make the delay control circuit to generate a more stable output voltage and to more precisely control the delay time of the voltage controlled delay cell.

To achieve the above-described or other objectives, the present invention provides a delay control circuit, which includes a first delay unit, a signal regulation unit, a selector and a second delay unit. The first delay unit is used for delaying an input signal and producing a delayed input signal. The signal regulation unit is coupled to the first delay unit and outputs a rising edge delay signal and a falling edge delay signal. The selector is coupled to the signal regulation unit and outputs a signal with adjusted duty cycle according to a control signal. The signal outputted by the selector is one of the rising edge delay signal and the falling edge delay signal. The second delay unit is coupled to the selector for delaying the output of the selector and outputting an output signal. Wherein, if the control signal is adjusted, the selector switches and outputs one of the rising edge delay signal and the falling edge delay signal according the adjusted control signal.

In an embodiment of the present invention, the above-mentioned signal regulation unit includes an AND gate and an OR gate. The above-mentioned AND gate is coupled between the first delay unit and the selector and outputs the rising edge delay signal to the selector according to the delayed input signal and the input signal. The above-mentioned OR gate is coupled between the first delay unit and the selector and outputs the falling edge delay signal to the selector according to the delayed input signal and the input signal. Final output signal used the selected signal and delay by another second delay unit.

In accordance to the above and other objectives, the present invention provides a delay control circuit, which includes a DLL, a delay unit, a big code unit, a small code unit, N pieces of AND gates, a signal regulation unit and a selector. The DLL outputs a delay control voltage according to a clock signal. The delay unit is for receiving an input signal and outputting N pieces of delayed input signals according to the delay control voltage, wherein N is a positive integer. The big code unit has N output terminals for outputting N pieces of first conversion signals, while the small code unit also has N output terminals for outputting N pieces of second conversion signals. Each of the above-mentioned AND gates has three input terminals, which are coupled respectively with the output terminals of the big code unit and the small code unit, and the AND gates output N pieces of operation signals according to the delayed input signals, the first conversion signals and the second conversion signals.

The signal regulation unit is coupled to the output terminals of the above-mentioned N AND gates and outputs a rising edge delay signal and a falling edge delay signal according to the operation signals. The mapping table is to ORed all consecutive delay phase signal to overcome problem shown in FIG. 2D. The ANDed path are the same as illustrate before. The selector is coupled to the signal regulation unit and outputs one of the rising edge delay signal DRS and the falling edge signal DFS according to the control signal. It should be noted that all of the above-mentioned AND gates, delayed input signals, the first conversion signals, the second conversion signals and the operation signals have an one-to-one mapping relationship.

In an embodiment of the present invention, the above-mentioned signal regulation unit includes a first AND gate and a first OR gate. The first AND gate is coupled between the above-mentioned N AND gates and the selector, and outputs a rising edge delay signal to the selector according to two of the operation signals, while the first OR gate is coupled between the above-mentioned N AND gates and the selector and outputs a falling edge delay signal to the selector according to the operation signals.

According to an embodiment of the present invention, the delay time of the signal rising edge and the signal falling edge can be simultaneously and respectively controlled by adjusting the duty cycle and performing a delay adjustment. Further, a DLL is employed to more precisely adjust the delay time of the rising edge and the delay time of the falling edge. Moreover, the present invention utilizes a small code unit and a big code unit to solve the problem encountered by the prior art that the delay time of the rising edge minus the delay time of the falling edge are larger than input pulse width are not respectively controlled.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 3A:
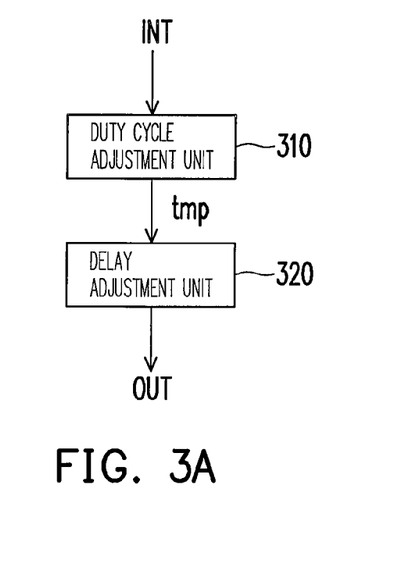
FIG. 3A is a block diagram of a delay control circuit according to an embodiment of the present invention.

FIG. 3A is a block diagram of a delay control circuit according to an embodiment of the present invention. The delay control circuit includes a duty cycle adjustment unit 310 and a delay adjustment unit 320. The duty cycle adjustment unit 310 is in charge of adjusting the duty cycle of an input signal INT according to the design requirement. After the adjustment, the duty cycle of the input signal INT gets larger or smaller, and outputs a signal tmp. The delay adjustment unit 320 is in charge of delaying the signal tmp to further generate an output signal OUT.

Figure 3B:
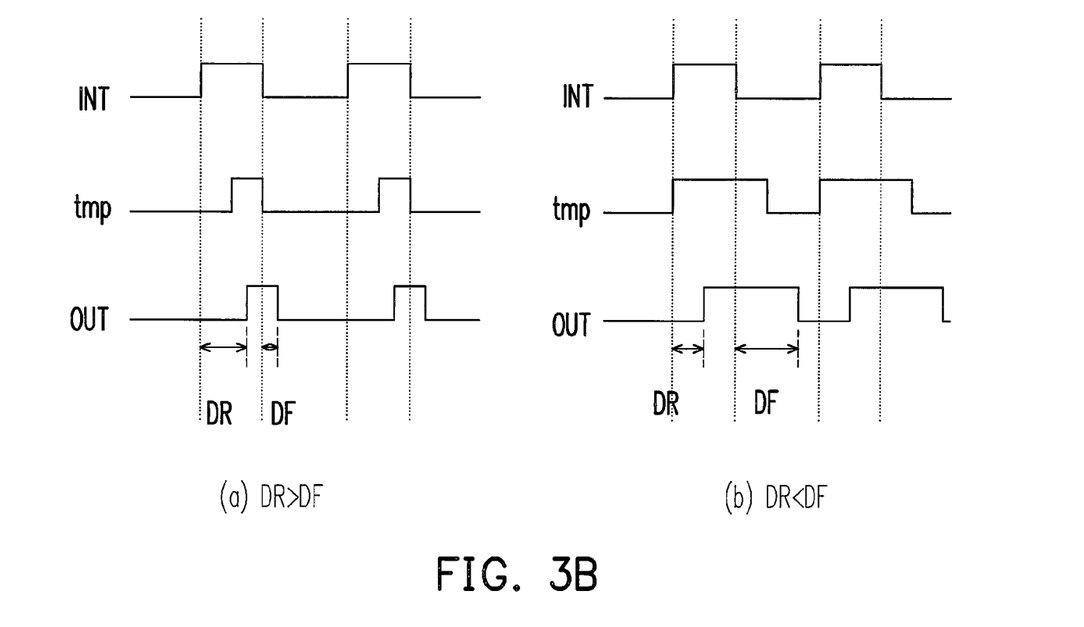
FIG. 3B is a signal timing diagram corresponding to the embodiments illustrated by FIG. 3A.

For a situation where the rising edge delay time and the falling edge delay time of the input signal INT are respectively adjusted, the output signal OUT can have the following two statuses: (a) the rising edge delay time is larger than the falling edge delay time (DR>DF); (b) the rising edge delay time is smaller than the falling edge delay time (DR<DF). FIG. 3B is a signal timing diagram corresponding to the embodiments illustrated by FIG. 3A. Referring to FIGS. 3A and 3B, the more details of the two statuses are described in the following.

To achieve the status (a), the signals INT, tmp and OUT are shown by FIG. 3B (a). Normally, the delay adjustment unit 320 delays the rising edge and the falling edge of the signal tmp by a same amount. Thus, to generate an output signal OUT with a rising edge delay time DR larger than the falling edge delay time DF, it needs to adjust the duty cycle of the input signal INT first. In the embodiment, the duty cycle adjustment unit 310 is in charge of reducing the duty cycle of the input signal INT as the first step. Thus, the rising edge of the input signal INT moves back for an amount and the updated signal is given by signal tmp in FIG. 3B (a). After that, the delay adjustment unit 320 delays the rising edge and the falling edge of the signal tmp by a same amount, and the desired output signal OUT is obtained, as shown in FIG. 3B (a), wherein the rising edge delay time DR thereof is larger than the falling edge delay time DF, since the resulting delay time of the rising edge is the delay performed by the delay adjustment unit 320 plus the delay performed by the duty cycle adjustment unit 310.

On the other hand, to achieve the status (b), i.e. to generate an output signal OUT with a rising edge delay time DR less than the falling edge delay time DF, it needs to enlarge the duty cycle of the input signal INT first. In the embodiment, the duty cycle adjustment unit 310 is in charge of enlarging the duty cycle of the input signal INT as the first step. Thus, the falling edge of the input signal INT moves back for an amount and the updated signal is given by signal tmp in FIG. 3B (b). After that, the delay adjustment unit 320 delays the rising edge and the falling edge of the signal tmp by a same amount, and the desired output signal OUT is obtained, as shown in FIG. 3B (b), wherein the rising edge delay time DR thereof is less than the falling edge delay time DF, since the resulting delay time of the falling edge is the delay performed by the delay adjustment unit 320 plus the delay performed by the duty cycle adjustment unit 310.

Figure 4A:
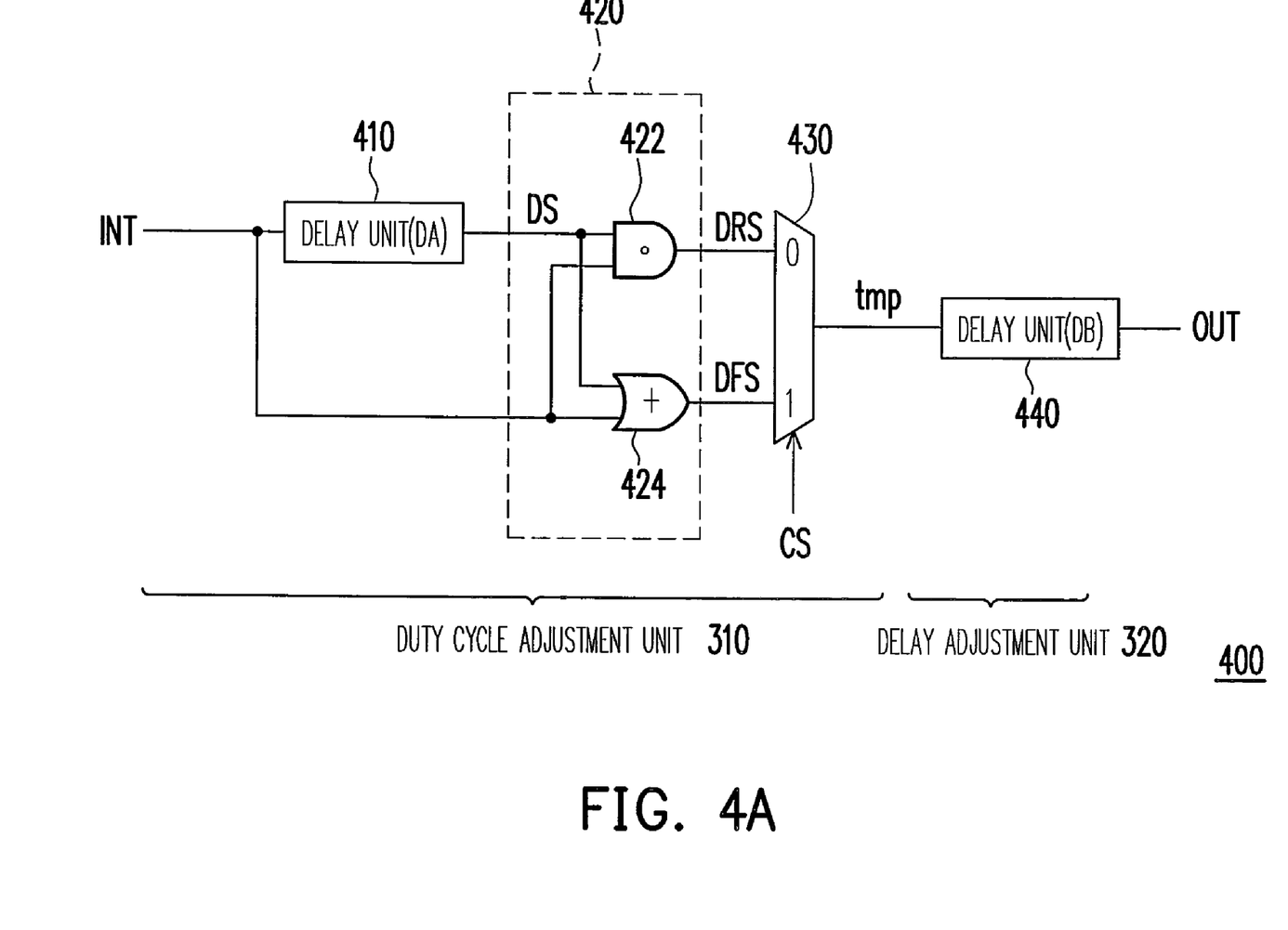
FIG. 4A is a schematic diagram of a delay control circuit according to an embodiment of the present invention.

In the following, the circuit structure of the present embodiment is further explained. FIG. 4A is a schematic drawing of a delay control circuit according to an embodiment of the present invention. Referring to FIGS. 4A and 3A, the delay control circuit 400 includes a duty cycle adjustment unit 310 and a delay adjustment unit 320. The duty cycle adjustment unit 310 includes a delay unit 410, a signal regulation unit 420 and a selector 430 (a multiplexer), while the delay adjustment unit 320 is formed by a delay unit 440. Wherein, the signal regulation unit 420 is formed by an AND gate 422 and an OR gate 424. The AND gate 422 and the OR gate 424 are respectively coupled between the delay unit 410 and the selector 430, and the delay unit 440 is coupled to the output of the selector 430. In the embodiment, the delay time of the delay unit 410 is DA, while the delay time of the delay unit 440 is DB. The time of the delay time DA and the delay time DB depend on the design requirement.

In the duty cycle adjustment unit 310, the delay unit 410 is used for delaying the above-mentioned input signal INT to generate a delayed input signal DS. The input signal INT and the delayed input signal DS are sent to the AND gate 422 to output the rising edge delay signal DRS with rising edge delay time of DA; the input signal INT and the delayed input signal DS are sent to the OR gate 424 to output a falling edge delay signal DFS with falling edge delay time of DA. The selector outputs one of the above-mentioned rising edge delay signal DRS or falling edge delay signal DFS signal according to a control signal CS. Hence, the signal tmp outputted from the duty cycle adjustment unit 310 is one of the rising edge delay signal DRS and falling edge delay signal DFS. Then, the signal tmp is further delayed by the delay unit 440 in the delay adjustment unit 320 to generate a desired output signal OUT, wherein if the outputted signal tmp is the rising edge delay signal DRS, the rising edge delay time of the output signal OUT is larger than the falling edge delay time thereof; if the outputted signal tmp is the falling edge delay signal DFS, the falling edge delay time of the output signal OUT is larger than the rising edge delay time thereof.

In the embodiment, the control signal CS controls the output of the selector by using a logic voltage level (logic 1 or logic 0). For example, when the control signal takes logic 0, the selector 430 outputs the above-mentioned rising edge delay signal DRS; when the control signal takes logic 1, the selector 430 outputs the above-mentioned falling edge delay signal DFS. However, in another embodiment, the assignment of the logic level for the control signal CS can be contrary thereto.

Figure 4B:
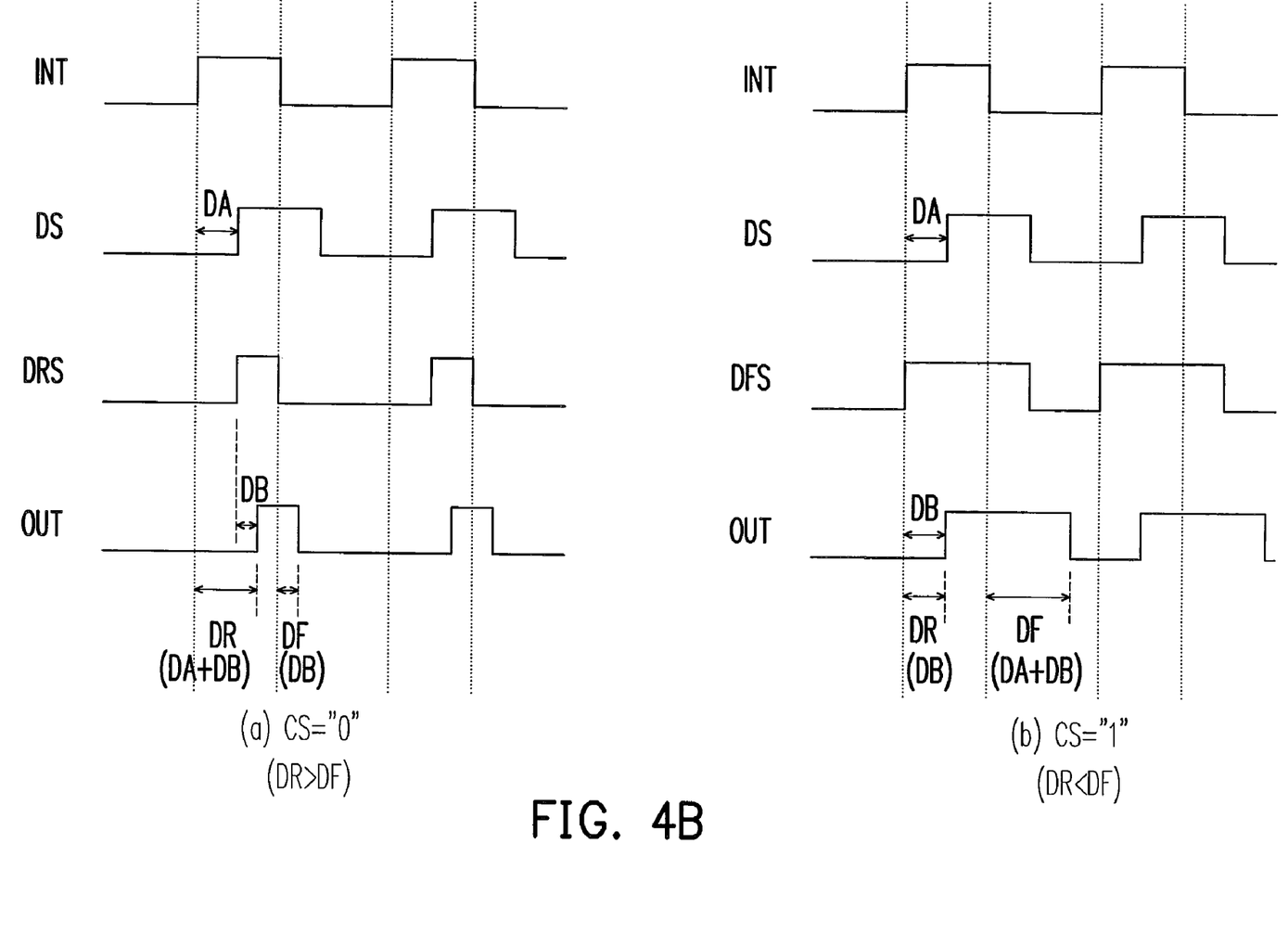
FIG. 4B is a signal timing diagram corresponding to the delay control circuit of FIG. 4A.

FIG. 4B is a signal timing diagram corresponding to the delay control circuit of FIG. 4A to explain the signal timing relationship of the embodiment.

Referring to FIGS. 4A and 4B, first, the input signal INT is delayed by the delay unit 410 and converted to the delayed input signal DS, which has obtained a delay time of DA. Next, the AND gate 422 generates the rising edge delay signal DRS according to the delayed input signal DS and the input signal INT, as shown in FIG. 4B (a), while the OR gate 424 generates the falling edge delay signal DFS according to the delayed input signal DS and the input signal INT, as shown in FIG. 4B (b). The rising edge delay signal DRS is generated by adjusting the duty cycle of the input signal INT to delay the rising edge of the input signal INT, while the falling edge delay signal DFS is generated by adjusting the duty cycle of the input signal INT to delay the falling edge of the input signal INT. The selector 430 outputs a corresponding signal tmp according to the control signal CS. Finally, the delay unit 440 performs a delay on the signal tmp with a delay time of DB to generate the output signal OUT.

In the embodiment, to generate an output signal OUT with the rising edge delay time DR larger than the falling edge delay time DF, the control signal CS is assigned with logic 0, so as to make the selector 430 to output the above-described rising edge delay signal DRS; to generate an output signal OUT with the rising edge delay time DR less than the falling edge delay time DF, the control signal CS is assigned with logic 1, so as to make the selector 430 output the above-described falling edge delay signal DFS.

Accordingly, when the control signal takes logic 0, the rising edge delay time DR of the output signal OUT is the delay time DA plus the delay time DB, while the falling edge delay time DF is merely the delay time DB, as shown by FIG. 4B (a); when the control signal takes logic 1, the rising edge delay time DR of the output signal OUT is merely the delay time DA, while the falling edge delay time DF is the delay time DB plus the delay time DB, as shown by FIG. 4B (b).

Figure 5:
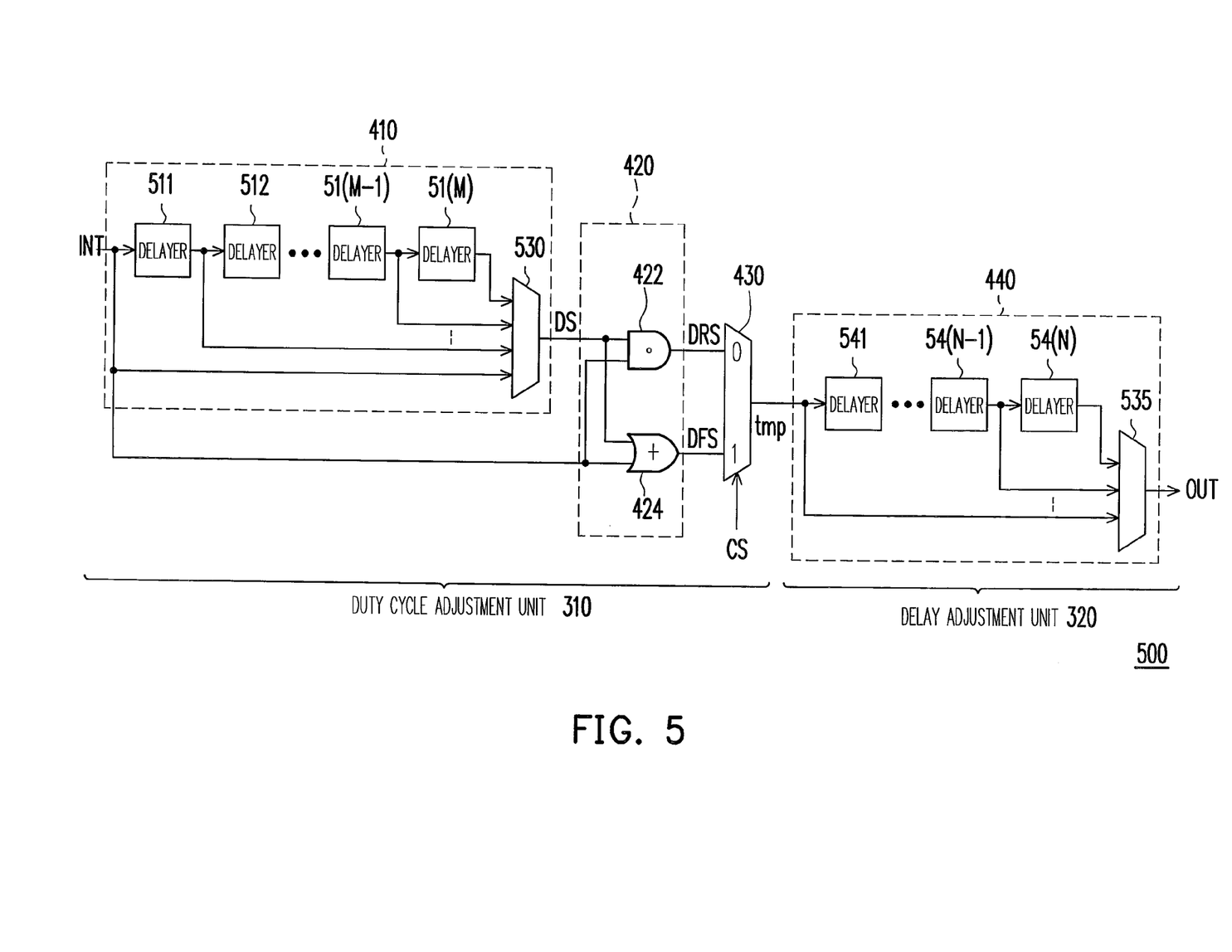
FIG. 5 is a schematic diagram of a delay control circuit according to another embodiment of the present invention.

FIG. 5 is a schematic drawing of a delay control circuit according to another embodiment of the present invention. The major difference of FIG. 5 from FIG. 4A resides in that they employ different delay units of 410 and 440. The delay unit 410 in FIG. 5 includes delayers 511~51(M) and a selector 530 (in the embodiment, the selector 530 can be a multiplexer), wherein the delayers 511~51(M) are in series connection to each other, gradually delay the input signal INT in stage-by-stage manner and are assigned with different delay time amounts according to the design requirement. Both the input signal INT and the output terminal of every delayer of 511~51(M) are coupled to the selector 530, so that the selector 530 is able to select a corresponding signal as the delayed input signal DS according to the design requirement, while the delay time of the delayed input signal DS depends on the selection of the selector 530.

The delay unit 440 in FIG. 5 includes delayers 541~54(N) and a selector 535, wherein the delayers 541~54(N) gradually delay the signal tmp outputted from the selector 430 in stage-by-stage manner, and then the selector 535 makes a selection and generates the output signal OUT. The delay unit 440 works based on the same operation principle as the unit 410 but a different quantity of the delayers thereof from the delay unit 410, and anyone skilled in the art would understand the operation principle very well without the additional depiction.

Figure 6:
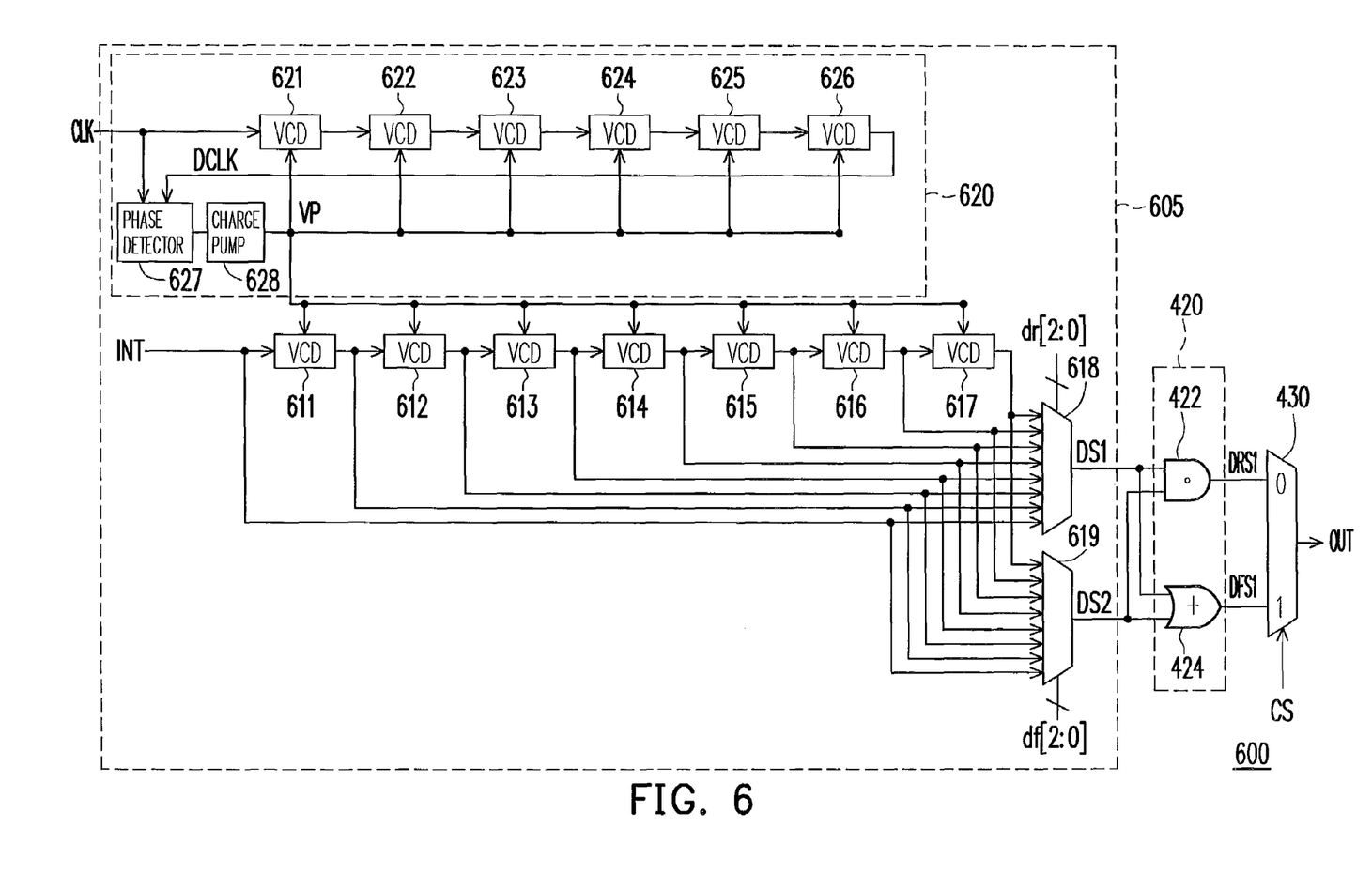
FIG. 6 is a schematic diagram of a delay control circuit according to another yet embodiment of the present invention.

FIG. 6 is a schematic drawing of a delay control circuit according to another yet embodiment of the present invention. The delay control circuit 600 includes a delay unit 605, a signal regulation unit 420 and a selector 430. The delay unit 605 includes a DLL 620, a plurality of voltage controlled delay cells (briefed as VCDs hereinafter) 611~617 and selectors 618 and 619. The circuit operation principles of the signal regulation unit 420 and the selector 430 are similar to the embodiment described with reference to FIG. 5, and therefore the description is not repeated.

The DLL 620 includes a phase detector 627, a charge pump 628 and a plurality of VCDs 621~626. The phase detector 627 controls the delay control voltage VP generated by the charge pump 628 according to the phase comparison result between a clock signal CLK and a delayed clock signal DCLK, and the generated delay control voltage VP is stable by means of the phase difference value specified by the phase detector 627. The delay time of each of the VCDs 621~626 can be adjusted according to the delay control voltage VP, and the delay control voltage VP makes the delay time of all the VCDs 621~626 the same as each other and stable. For example, if the phase detector 627 specifies the phase difference to correspond to 6.6 ns, then, the delay time of every VCD of 621~626 should be 1.1 ns (the result of 6.6 ns divided by 6, the number of VCDs 621~626).

The delay unit 605 uses the delay control voltage VP to control the delay time of each of the VCDs 621~626 and gradually in stage-by-stage manner delays the above-mentioned input signal INT received by the delayer 611. As a result, the output terminal of each delayer of 611~617 accordingly outputs a delayed input signal with different delay time. The selector 618, 619 select respectively a delayed input signal DS1 and a delayed input signal DS2 from the output terminals of the delayers 611~617 to the signal regulation unit 420 according to the control signals dr[2:0] and df[2:0]. It can be seen there from that the delay function of, for example the delay unit 440 in the embodiment of FIG. 5, can be integrated into the delay unit 605. Wherein, by using a combination of the delayed input signals DS1 and DS2, an output signal OUT corresponding to different rising edge delay time and falling edge delay time is obtained for output. For example, if the delay time of the delayed input signal DS1 is (DA+DB) and the delay time of the delayed input signal DS2 is DB, the output signal OUT same as the one in the embodiment of FIG. 4A can be generated.

The delayed input signals DS1 and DS2 are sent to the AND gate 422 for operation and outputting the rising edge delay signal DRS1 with a rising edge delay time of Max {DR, DF} and a falling edge delay time of Min {DR, DF}; or DS1 and DS2 are sent to the OR gate 424 for operation and outputting the falling edge delay signal DFS1 with a rising edge delay time of Min{DR,DF} and a falling edge delay time of Max{DR,DF}. Since both DS1 and DS2 are the delayed input signal INT, hence, regardless of the rising edge delay signal DRS1 or the falling edge delay signal DFS1 has at least the delay time of DB in comparison with the input signal INT. In other words, the delay unit 605 in FIG. 6 functions as both the delay unit 410 and the delay unit 440 in FIG. 4A. Therefore, the delay control circuit of the embodiment in FIG. 6 is superior in a simplified circuit structure, low cost and generating more precise delay time. For other operation details of the delay control circuit in FIG. 6 can be referred to the embodiment in FIG. 4A, and are not repeated.

Figure 7A:
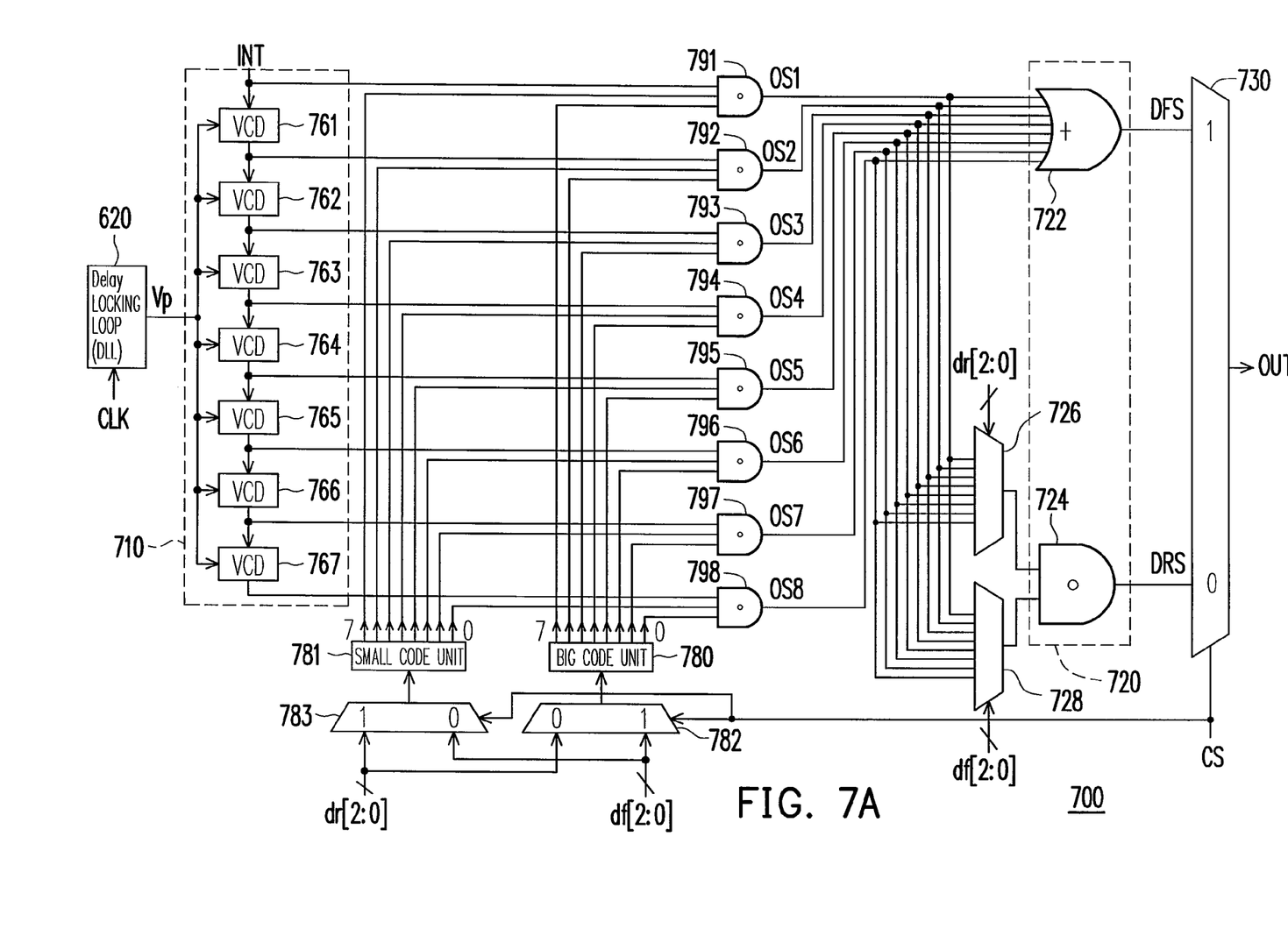
FIG. 7A is a schematic diagram of a delay control circuit according to another yet embodiment of the present invention.

FIG. 7A is a schematic drawing of a delay control circuit according to another yet embodiment of the present invention. The delay control circuit 700 includes a DLL 620, a delay unit 710, AND gates 791~798, a signal regulation unit 720, a big code unit 780, a small code unit 781 and selectors 726, 728, 730, 782 and 783. The DLL 620 outputs a delay control voltage VP according to a clock signal CLK. The delay unit 710 is formed by N pieces of voltage controlled delay cells for receiving the input signal INT and outputs N pieces of delayed input signals according to the delay control voltage VP. The number N of the voltage controlled delay cells depends on the desired delay time, and N=8 in the embodiment. The delay unit 710 outputs 8 pieces of delayed input signals including the input signal INT.

The big code unit 780 and the small code unit 781 respectively have eight output terminals, at which the outputs are sent to the corresponding AND gates 791~798. The output signals of the big code unit 780 are termed as the first conversion signals, while the output signals of the small code unit 781 are termed as the second conversion signals. The logic levels of the first conversion signals and the second conversion signals vary with the control signals CS, dr[2:0] and df[2:0]. Each of the AND gates 791~798 corresponds one of the first conversion signals, one of the second conversion signals and a delayed input signal, wherein the delayed input signal corresponding to the AND gate 791 is the input signal INT which is directly coupled to one of the input terminals of 791, as shown by FIG. 7A.

In other words, all the AND gates 791~798 are controlled by the big code unit 780 and the small code unit 781. For example, only when the first conversion signal and the second conversion signal corresponding to the AND gate 791 take a high logic level, the AND gate 791 can output a signal same as the input signal INT; otherwise, a low logic level is output. Similarly, for the AND gate 792, only when the corresponding first conversion signal and the corresponding second conversion signal take the high logic level, the AND gate 792 can output a signal same as the output of the VCD 761, and analogically for the rest. Thus, the AND gates 791~798 output operation signals OS1~OS8 according to the input signal INT, the outputs of the VCDs 761~767, the first conversion signals and the second conversion signals.

The signal regulation unit is coupled to the output terminals of the AND gates 791~798 and outputs a rising edge delay signal DRS and a falling edge delay signal DFS to the selector 730 according to the output operation signals OS1~OS8. Then, the selector 730 selects one of the rising edge delay signal DRS and the falling edge delay signal DFS according to the control signal CS. Wherein, the rising edge delay signal DRS is obtained by an 'AND' logic operation of the AND gate 722 on two of the operation signals OS1~OS8; while the falling edge delay signal DFS is obtained by an 'OR' logic operation of the OR gate 724 on the operation signals OS1~OS8. In the embodiment, the selector 726, 728 are coupled between the AND gate 724 and the output terminals of the AND gates 791~798. The selector 726, 728 select respectively one of the operation signals OS1~OS8 to the AND gate 724 according to the control signals dr[2:0], df[2:0], and the AND gate 724 outputs the rising edge delay signal DRS according to the outputs of the selector 726, 728.

From the above description, it can be seen that by adjusting the control signals CS, dr[2:0] and df[2:0], the outputs of the big code unit 780 and the small code unit 781 gets adjusted, which further functions to adjust the outputs of the AND gates 791~798 and the rising edge delay time and the falling edge delay time of the output signal OUT are accordingly varied.

Figure 7B:
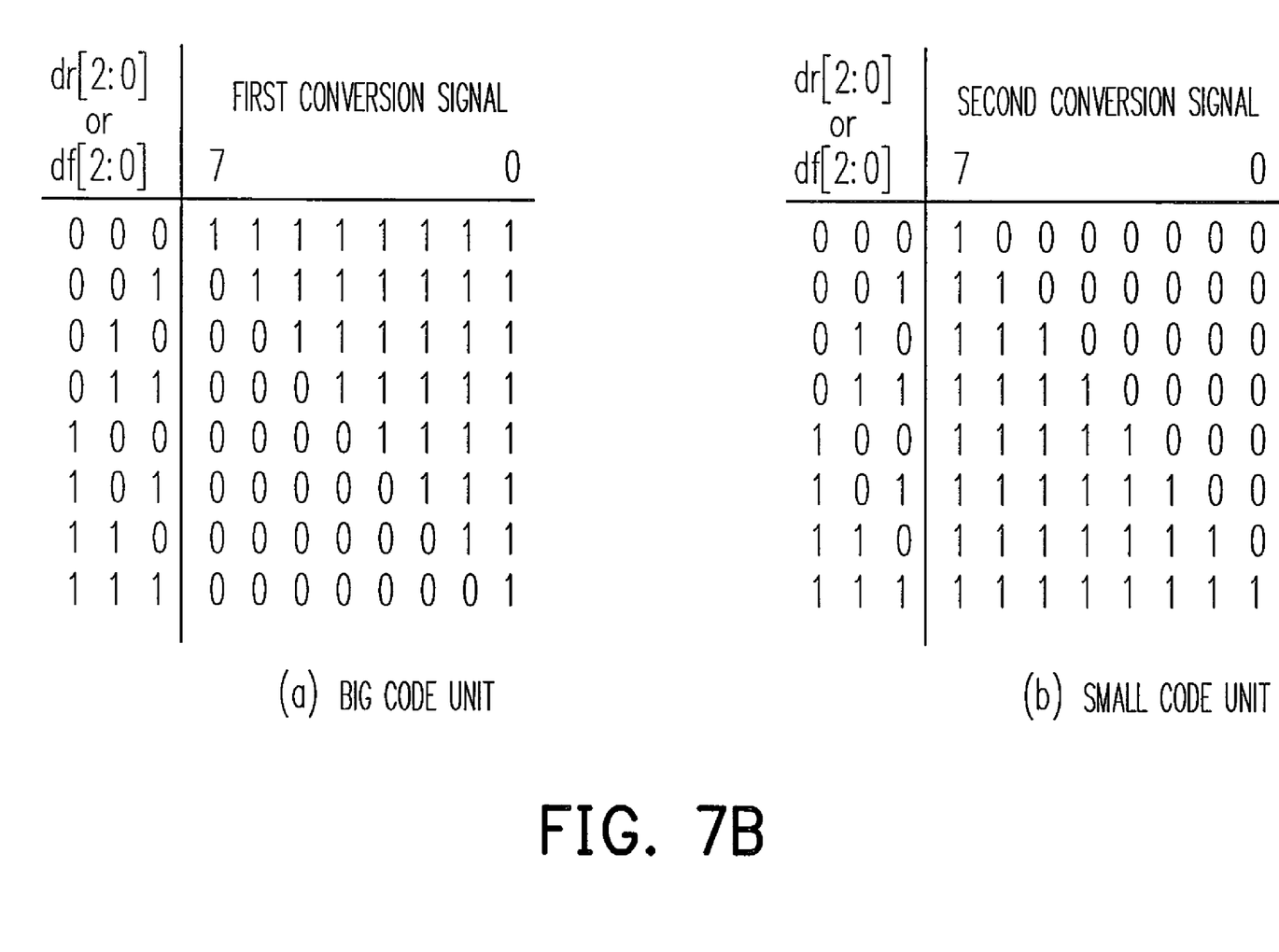
FIG. 7B is an output comparison table of the first conversion signals and the second conversion signals according to the embodiment of FIG. 7A.

The outputs of the big code unit 780 and the small code unit 781 can be referred by FIG. 7B, which is an output comparison table of the first conversion signals and the second conversion signals according to the embodiment. The big code unit 780 is coupled to the selector 782, while the small code unit 781 is coupled to the selector 783. The selectors 782 and 783 respectively adjust the first conversion signals and the second conversion signals according to the corresponding control signals dr[2:0] and df[2:0]. In FIG. 7B, the control signal dr[2:0] and the control signal df[2:0] are respectively a 3-bit digital signal and the control signal CS determines which of the control signal dr[2:0] and the control signal df[2:0] is sent to the big code unit 780 or the small code unit 781. For example, when the control signal CS is logic 1, the big code unit 780 receives the control signal df[2:0] and the small code unit 781 receives the control signal dr[2:0], while when the control signal CS is logic 0, the big code unit 780 receives the control signal dr[2:0] and the small code unit 781 receives the control signal df[2:0].

The mapping of the first conversion signals output from the big code unit 780 to the control signals dr[2:0] or df[2:0] is shown by FIG. 7B (a). The first conversion signals comprise of eight sets (0~7) respectively corresponding to the AND gates 791~798. Similarly, the mapping of the second conversion signals output from the small code unit 781 to the control signals dr[2:0] or df[2:0] is shown by FIG. 7B (b). The second conversion signals also comprise of eight sets (0~7) respectively corresponding to the AND gates 791~798. Hence, only by adjusting the control signals dr[2:0] and df[2:0], the outputs of the AND gates 791~798 get adjusted and the corresponding output signal OUT is accordingly output.

In summary, the present invention proposes two steps to respectively adjust the duty cycle and the delay, so as to simultaneously and respectively control the rising edge delay time and the falling edge delay time. In addition, a DLL is employed to more precisely adjust the delay time of the rising edge and the delay time of the falling edge. Moreover, the present invention utilizes a small code unit and a big code unit to solve the problem encountered by the prior art that the delay time of the rising edge and the delay time of the falling edge are not respectively controlled.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A delay control circuit, comprising:
   a delay unit, having a delay-locking loop, the delay locking loop receiving a clock signal and outputting a delay control voltage, wherein the delay unit delays an input signal and generates a first delayed input signal and a second delayed input signal according to the delay control voltage, a first and second control signals, and the input signal;
   a signal regulation unit, coupled to the delay unit, for outputting a rising edge delay signal and a falling edge delay signal according to the first delayed input signal and the second delayed input signal; and
   a selector, coupled to the signal regulation unit, for outputting one of the rising edge delay signal or the falling edge delay signal according to a control signal;
   wherein, the delay time of the first delayed input signal is larger than the delay time of the second delayed input signal.

2. The delay control circuit as claimed in claim 1, wherein the delay-locking loop outputs the delay control voltage according to the clock signal and the delay unit comprises:
   a plurality of voltage controlled delay cells, connected in series to each other, for receiving and gradually delaying the input signal in stage-by-stage manner and adjusting the delay time of each the voltage controlled delay cells according to the delay control voltage;
   a first selector, coupled to the output terminals of the voltage controlled delay cells, for selecting the output from one of the voltage controlled delay cells and the input signal, and outputting the first delayed input signal according to the first control signal; and
   a second selector, coupled to the output terminals of the voltage controlled delay cells, for selecting the output from one of the voltage controlled delay cells and the input signal, and outputting the second delayed input signal according to the second control signal.

3. The delay control circuit as claimed in claim 2, wherein the delay-locking loop comprises:
   a plurality of first voltage controlled delay cells, connected in series to each other, for receiving and gradually delaying the clock signal in stage-by-stage manner and outputting a delayed clock signal from the last stage of the first voltage controlled delay cells;
   a phase detector, for outputting a voltage adjustment signal according to the clock signal and the delayed clock signal; and
   a charge pump, coupled between the phase detector and the first voltage controlled delay cells, for outputting the delay control voltage according to the voltage adjustment signal;
   wherein, the first voltage controlled delay cells adjust the delay time of the delayed clock signal according to the delay control voltage.

4. The delay control circuit as claimed in claim 2, wherein the selector, the first selector and the second selector respectively comprise a multiplexer.

5. The delay control circuit as claimed in claim 1, wherein the signal regulation unit comprises:

an AND gate, coupled to the delay unit and the selector, for outputting the rising edge delay signal to the selector according to the first delayed input signal and the second delayed input signal; and an OR gate, coupled to the delay unit and the selector, for outputting the falling edge delay signal to the selector according to the first delayed input signal and the second delayed input signal.

6. A delay control circuit, comprising:

a delay-locking loop, for outputting a delay control voltage according to a clock signal;

a delay unit, for receiving an input signal and outputting N pieces of delayed input signals according to the delay control voltage, wherein N is a positive integer;

a big code unit, having N output terminals, for outputting N pieces of first conversion signals;

a small code unit, having N output terminals, for outputting N pieces of second conversion signals;

N AND gates, wherein each the AND gates receives the delayed input signals correspondingly, the first conversion signals and the second conversion signals and outputs an operation signal;

a signal regulation unit, coupled to the output terminals of the AND gates, for outputting a rising edge delay signal and a falling edge delay signal according to the operation signals; and a selector, coupled to the signal regulation unit, for outputting the first signal or the second signal according to a control signal.

7. The delay control circuit as claimed in claim 6, wherein the delay-locking loop comprises:

a plurality of first voltage controlled delay cells, connected in series to each other, for receiving and gradually delaying the clock signal in stage-by-stage manner and outputting a delayed clock signal from the last stage of the first voltage controlled delay cells;

a phase detector, for outputting a voltage adjustment signal according to the clock signal and the delayed clock signal; and a charge pump, coupled between the phase detector and the first voltage controlled delay cells, for outputting the delay control voltage according to the voltage adjustment signal;

wherein, the first voltage controlled delay cells adjust the delay time of the delayed clock signal according to the delay control voltage.

8. The delay control circuit as claimed in claim 6, wherein the delay unit comprises:

(N−1) pieces of voltage controlled delay cells, wherein the delay unit adjusts the delay time of each the voltage controlled delay cells according to the delay control voltage, the voltage controlled delay cells are connected in series to each other for receiving and gradually delaying the input signal in stage-by-stage manner, the delay unit outputs the delayed input signals according to the input signal and the outputs of the voltage controlled delay cells, and one of the delayed input signals is the input signal.

9. The delay control circuit as recited in claim 6, wherein the signal regulation unit comprises:

a first AND gate, coupled between the AND gates and the selector, for outputting the rising edge delay signal to the selector according to the operation signals; and a first OR gate, coupled between the AND gates and the selector, for outputting the falling edge delay signal to the selector according to two of the operation signals.

10. The delay control circuit as claimed in claim 6, comprising:

a first selector, coupled to a first control signal and a second control signal, for outputting o the first control signal or the second control signal to the small code unit according to the control signal; and a second selector, coupled to the first control signal and the second control signal, for outputting one of the first control signal and the second control signal to the big code unit according to the control signal;

wherein the small code unit outputs the first conversion signals according to the output of the first selector, while the big code unit outputs the second conversion signals according to the output of the second selector.

11. The delay control circuit as claimed in claim 10, wherein the selector, the first selector and the second selector respectively comprise a multiplexer.

* * * * *